United States Patent [19]

Ida et al.

[11] Patent Number: 5,669,800

[45] Date of Patent: Sep. 23, 1997

[54] PROCESS OF FORMING HOLES IN A PHOTOSENSITIVE RESIN LAYER TO PRODUCE CATHODES WITH MICROTIPS

[75] Inventors: Michel Ida, Voreppe; Brigitte Montmayeul, Brignoud, both of France

[73] Assignee: Commissariat a l'Energie Atomique, Paris, France

[21] Appl. No.: 533,719

[22] Filed: Sep. 26, 1995

[30] Foreign Application Priority Data

Oct. 10, 1994 [FR] France .................. 94 12065

[51] Int. Cl.$^6$ .................................. H01J 9/02
[52] U.S. Cl. .................................. 445/25; 430/396
[58] Field of Search .............. 445/24, 50; 430/396

[56] References Cited

U.S. PATENT DOCUMENTS

| | | | |
|---|---|---|---|
| 4,501,637 | 2/1985 | Mitchell et al. | 257/98 |
| 4,668,080 | 5/1987 | Gale et al. | |
| 5,219,310 | 6/1993 | Tomo et al. | 445/24 |

FOREIGN PATENT DOCUMENTS

| | | |
|---|---|---|
| 38 21 268 | 12/1989 | Germany . |
| 2 253 925 | 9/1992 | United Kingdom . |

OTHER PUBLICATIONS

Patent Abstracts of Japan, vol. 7, No. 30 (P–173), Feb. 5, 1983, JP–57–181549, Nov. 9, 1982.
Patent Abstracts of Japan, vol. 7, No. 75 (P–187), March 29, 1983, JP–58–4148, Jan. 11, 1983.

*Primary Examiner*—Kenneth J. Ramsey
*Attorney, Agent, or Firm*—Oblon, Spivak, McClelland, Maier & Neustadt, P.C.

[57] ABSTRACT

A process for the formation of holes in a photosensitive resin layer, which can be applied to the production of electron sources having emissive cathodes with microtips and flat display screens. According to this process, a resin layer is exposed through a monolayer of balls transparent to an exposure light, with each ball focussing the light onto the resin layer and in this way bringing about the exposure of an area of said resin layer so that the thus exposed resin layer is developed.

14 Claims, 3 Drawing Sheets

PROCESS OF FORMING HOLES IN A PHOTOSENSITIVE RESIN LAYER TO PRODUCE CATHODES WITH MICROTIPS

BACKGROUND OF THE INVENTION

1. Field of the Invention

The present invention relates to a process for the formation of holes in a photosensitive resin layer.

It more particularly applies to the production of electron sources having emissive cathodes with microtips, which can in particular be used for the production of display means by field emission-excited cathodoluminescence.

The invention in particular makes it possible to produce large, microtip flat screens, e.g. larger than 14 inches (approximately 35 cm) and even having a surface area close to 1 m$^2$. Obviously screens with a much larger size can be produced by means of the present invention.

The invention also applies to the production of etched anti-reflection layers, sensors for microsystems and anti-reflection layers with respect to radar waves.

2. Discussion of the Related Art

Electron sources having emissive cathodes with microtips and their production processes are e.g. described in the following documents to which reference should be made:

(1) FR-A-2 593 953 (cf. also EP-A-234 989 and U.S. Pat. No. 4,857,161), (2) FR-A-2 687 839 (cf. also EP-A-558 393)

To facilitate the understanding of the technical problem solved by the present invention, a description will be given hereinafter of a known example of a process for the production of an electron source having emissive cathodes and microtips with reference to the enclosed FIGS. 1 to 3.

FIG. 1 shows an already produced structure comprising on a substrate 2 surmounted by an insulator 4, a system of cathode conductors 6 and grids 8 superimposed in crossed form, with an intermediate insulator 10 and a layer 12, e.g. of nickel, deposited on the surface to serve as a mask during the microtip production operations.

The nickel layer 12, the grids 8 and the insulator 10 have holes 14, on whose bottom will subsequently be deposited the microtips constituted by a conductive metal electrically linked with the cathode conductors.

The production of the microtips will now be explained with reference to FIG. 2. Firstly deposition e.g. takes place of a molybdenum layer 18 on the complete structure. The layer 16 has an approximate thickness of 1.8 µm. It is deposited under normal incidence with respect to the surface of the structure.

This deposition procedure makes it possible to obtain molybdenum cones 18 located in the holes 14 and having a height of 1.2 to 1.5 µm. These cones constitute electron-emitting microtips.

This is followed by the selective dissolving of the nickel layer 12 using an electrochemical process, so as to free, in the manner shown in FIG. 3, the perforated grids 8, which are e.g. of niobium, and bring about the appearance of the electron-emitting microtips 18.

With the exception of a few technical variants, the method described relative to FIGS. 1, 2 and 3 is that used up to now for producing the microtips of electron sources having emissive cathodes with microtips.

In order that the size and positioning of the microtips 18 are correct, it is obviously necessary to perfectly control the size of the holes made in the grids 8 and in the insulator 10.

Therefore the problem is as follows. It is a question of producing on all the surfaces to receive the microtips holes with an average diameter of e.g. 1.3 µm or less.

The methods used at present for doing this are photoengraving processes using direct spraying or the photorepetition of an elementary pattern reproduced on all the surfaces. In the case of large electron sources exceeding 14 inches (approximately 35 cm), these processes very rapidly assume a highly constraining character.

Direct spraying requires the production of a large, scale 1 mask having submicron patterns. This mask is difficult to produce above a 14 inch diagonal.

With regards to the photorepetition, a small mask is used, said size being determined by the resolution of the patterns used. For a resolution of 1 µm, use is e.g. made of a mask with a side length of 20 to 50 mm, so that it is necessary to repeat the exposure operation a large number of times, this being necessary in photoengraving to cover the total surface of the electron source.

These two methods (one using direct spraying and the other photorepetition) are consequently difficult to use in the production of large electron sources.

SUMMARY OF THE INVENTION

The present invention makes it possible to produce holes much more easily than in the aforementioned, known processes.

The present invention relates to a very simple process for the formation of holes in a photosensitive resin layer. The invention makes it possible to form holes, whose diameter can be approximately 1 µm or less than 1 µm on large or small surfaces.

The invention makes it possible to expose a photosensitive resin layer at points thereof corresponding to the locations of the holes to be formed in the resin.

Once said resin has been developed (i.e. after dissolving the exposed areas), it will serve as a mask for forming holes in a structure on which the resin layer is located. For example, on considering the structure described relative to FIGS. 1 to 3, the resin layer will serve, after development, for the etching of the grids 8 and the intermediate insulator 10.

More specifically, the present invention relates to a process for the formation of holes in a positive, photosensitive resin layer by means of an exposure light, said process being characterized in that it comprises the following stages:

formation takes place of a monolayer of balls transparent to said exposure light and in direct contact with the resin layer, the resin layer is exposed by the exposure light through the monolayer of balls, each ball concentrating said light at the contact point of said ball with the resin layer on which it is placed, thus bringing about the exposure of an area of said resin layer, the exposure light forming a parallel, collimated beam with a constant light intensity over the entire monolayer of balls and the thus exposed resin layer is developed leading to the formation of holes in said layer at the location of the exposed areas.

A first advantage of the process according to the invention is the great simplicity of this process compared with conventional photoengraving processes. Thus, the process of the invention uses no special mask and requires no precise alignment stages.

A second advantage of this process is the possibility of treating large surfaces according to the invention, so that it is possible to produce large electron sources having microtips.

Thus, for treating a surface according to the invention, it is merely necessary to spread thereon a photosensitive resin and, after drying the latter to cover the surface with balls, no matter what the dimensions of the surface in question.

Other advantages of the invention will become apparent hereinafter.

In the present invention, the balls can be contiguous or, conversely, non-contiguous and in this case they can have a random distribution.

According to a first embodiment of the process according to the invention, the monolayer of balls is formed by depositing these balls on the surface of the photosensitive resin layer.

In this case, the balls can be deposited by centrifuging or spraying or by any other method for the laminar entrainment or movement of the balls in the liquid phase, on the surface of the photosensitive layer or by any other ball spreading method.

The balls can be removed from the surface of the photosensitive resin layer prior to its development, but after its exposure. In this case the balls can be removed by entrainment by means of a liquid or in a bath subject to ultrasonic action.

As a variant, the balls are left on the resin layer until the latter is developed and are then entrained in the development bath and can then be recovered by filtering the bath.

According to a second embodiment of the process according to the invention, the monolayer of balls is formed by maintaining said balls on a support transparent to the exposure light and by applying the thus maintained balls to the surface of the photosensitive resin layer. The balls can be kept on the support by means of a binder or electrostatic forces.

For the performance of the present invention, it is e.g. possible to use balls with a diameter of 1 to 10 µm.

The present invention also relates to a process for the production of an electron source having emissive cathodes with microtips, according to which:

a structure is formed comprising cathode conductors on a substrate, an electrically insulating layer on said cathode conductors and, on said electrically insulating layer, grids forming an angle with the cathode conductors, in the areas where the grids intersect the cathode conductors, holes are formed through the grids and the insulating layer and electron-emitting material microtips are formed in these holes on the cathode conductors, said process being characterized in that the holes are obtained by forming a positive, photosensitive resin layer on the surface of the structure, by forming holes in the resin layer according to the hole formation process according to the invention and by etching the grids and the insulating layer through the holes formed in the resin layer.

Thus, the latter is used as a mask for creating in the underlying structure the holes used for housing the microtips.

By means of a screening mask opaque to the exposure light, it would advantageously be possible to reserve regions in which no holes are formed. This screen would be placed between the exposure light source and the monolayer of balls.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
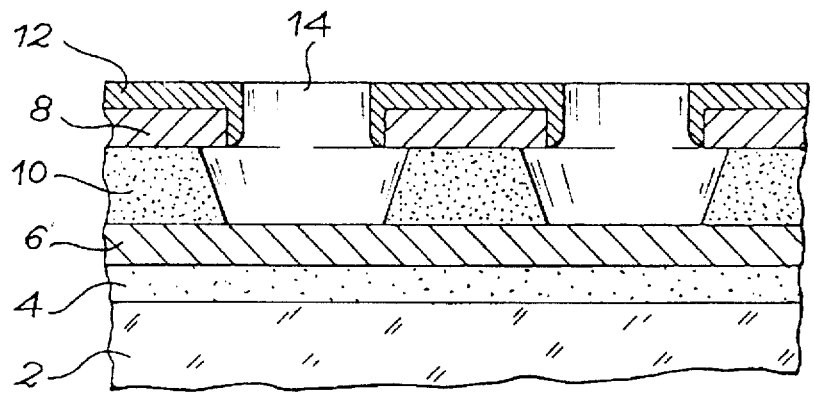
FIGS. 1 to 3, already described, diagrammatically and partially a known process for the production of an electron source having emissive cathodes with microtips.
Figure 2:
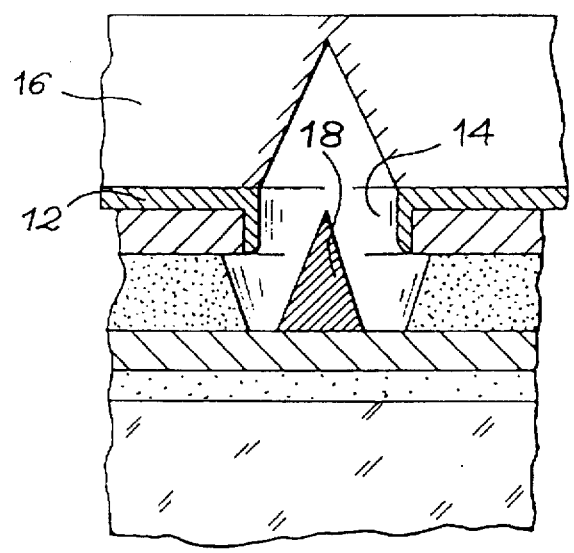
Figure 3:
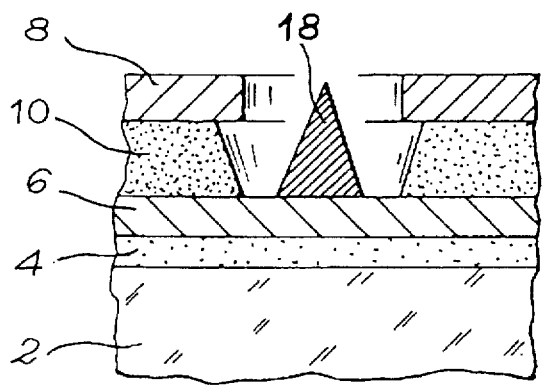
Figure 4:
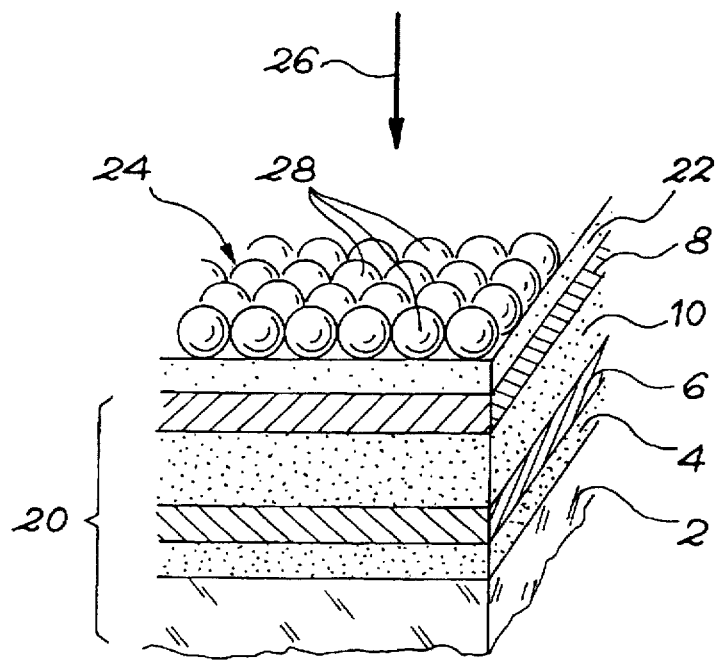
FIG. 4 A diagrammatic, partial view of a monolayer of contiguous balls permitting the implementation of the process according to the invention.

FIG. 4 diagrammatically and partially shows the structure referred to in the description of FIGS. 1 to 3 and which comprises the substrate 2, insulator 4, cathode conductors 6, grids 8 and intermediate insulator 10.

It is proposed to produce holes in the grids 8 and intermediate insulator 10 by means of a process according to the invention.

In order to make said holes, on the surface of the structure 20 in FIG. 4 is deposited a positive, photosensitive resin layer 22. On the latter is then deposited a monolayer 24 of balls 28 transparent to the light 26 used for exposing the resin.

This resin layer is exposed by the light 26 through the layer 24 of balls and perpendicular to the resin layer 22. This light 26 forms a collimated, parallel light beam with a constant light intensity over the entire surface of the monolayer of balls, said beam coming from a not shown light source.

Figure 5:
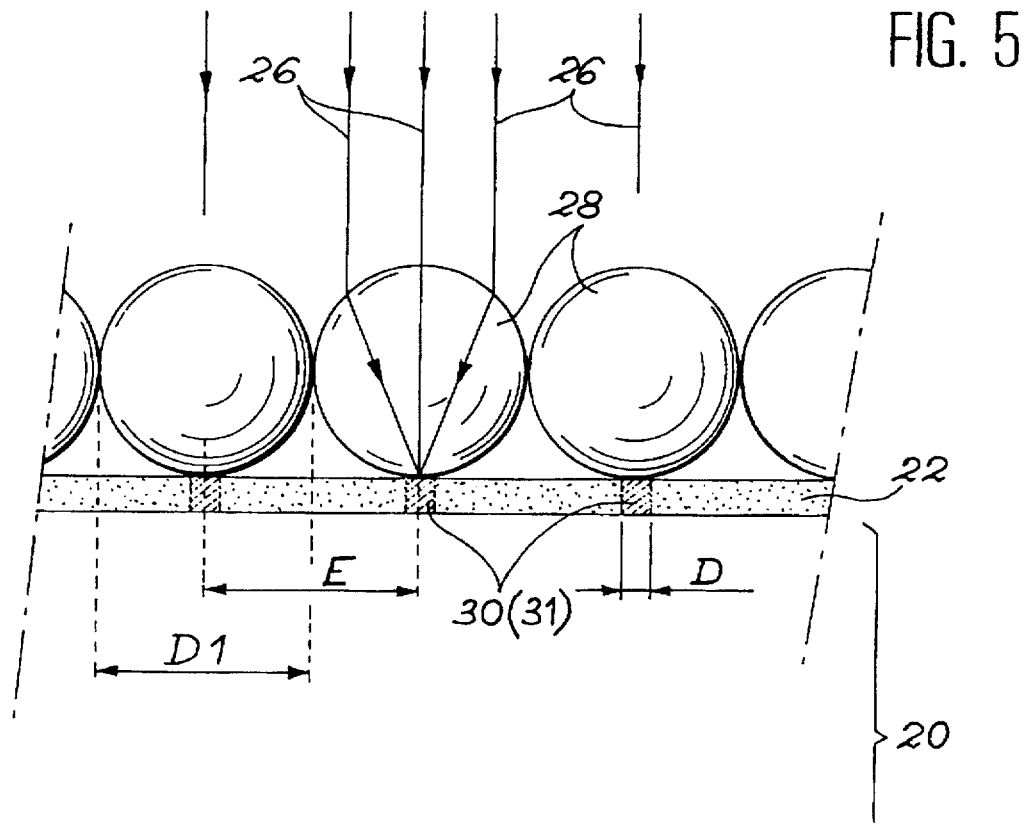
FIG. 5 Diagrammatically the process according to the invention.

As can be seen in FIG. 5, each of the balls 28 concentrates said light at the contact point of said ball with the resin layer 22 and thus brings about the exposure of an area 30 of said resin layer located at the contact point between the ball and the resin layer.

It is then merely necessary to remove the balls from the surface of the structure 20 and develop the thus exposed resin layer (in other words the exposed resin areas are dissolved), leading to the formation of holes 31 in the resin layer at the location of the exposed areas 30.

It would also be possible to leave the balls on the resin layer, develop the thus exposed resin layer and recover the balls by filtering the solvent used for dissolving the exposed areas.

In order that the resin can be exposed in its entire thickness at the areas 30, it is necessary for said thickness to be small of the same order of magnitude as the corresponding light spot, e.g. 1 µm.

The expert is able to choose for the balls the size and refractive index able to supply a light spot with an appropriate diameter.

Use is e.g. made of silica balls for an exposure light in the near ultraviolet.

Obviously, use is made of a resin whose attack rate, as a function of the exposure light dose received by said resin makes it possible to obtain freedom from the effects due to the parasitic exposure light which could pass between the balls.

On considering FIG. 5, reference is made to a supplementary advantage of the process according to the invention, namely that the diameter D of the light spot induced by each ball can easily be adjusted to values of approximately 1 µm or below, by choosing an appropriate diameter D1 for the balls and also the exposure time.

The balls transparent to the exposure light concentrate the light beam at the contact point of each glass ball and the photosensitive resin layer. The surface of the resulting light spot is not homogeneously illuminated. The light intensity which it receives is at a maximum in the center of the spot and decreases on moving towards the edges. Thus, by acting on the exposure time, it is possible to adjust the diameter of the exposed area over the entire thickness of the photosensitive resin layer and thus adjust the diameter of the holes.

The less the resin layer is exposed through the balls, the smaller the surface of the resin layer which is exposed and is therefore solubilizable and the smaller the size of the holes formed in the resin and therefore the size of the holes formed through the same in the grids and the intermediate insulator.

The decrease of the size of the holes formed in the grids and the intermediate insulator advantageously makes it possible to decrease the microtip control voltage.

In the case of FIGS. 4 and 5, the balls deposited on the surface of the structure 20 are contiguous.

In this case, a supplementary advantage of the process according to the invention is that the diameter D1 of the balls 28 determines the spacing E between the centers, of the holes formed in the resin layer. Therefore a choice is e.g. made of calibrated balls, whose respective diameters are between 1 and 10 μm. It is also possible to refer to microballs.

Figure 6:
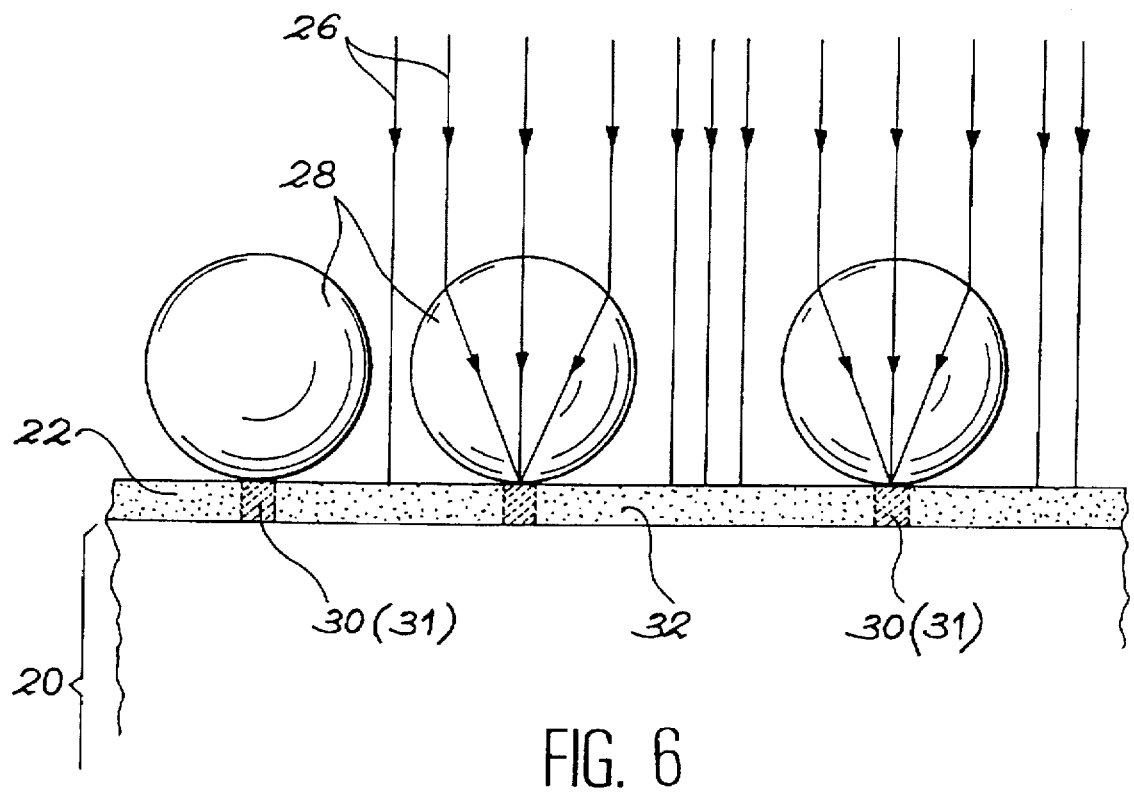
FIG. 6 Diagrammatically another process according to the invention using a monolayer of non-contiguous balls.

FIG. 6 diagrammatically illustrates the possibility of depositing on the surface of the resin layer 22 a monolayer of balls which are not contiguous and which can have a random distribution.

In order to obtain such a monolayer of non-contiguous balls, it is e.g. possible to use the following method for depositing said balls on the surface of the photosensitive layer: spraying the balls in solution in a water-ethanol mixture. This possibility of using non-contiguous balls constitutes another advantage of the invention, because the exposure dose is much higher at the concentration point (exposed area 30) than around the non-contiguous balls, i.e. in the areas 32 of FIG. 6.

An explanation is given hereinafter as to how the holes 14 can be formed in the grids 8 and the intermediate insulator 10 referred to in conjunction with FIGS. 1 to 4, using a process according to the invention.

More specifically, it is desired to form a microtip emissive cathode source and for this purpose, the first step is to form on the substrate 2 the insulator 4, the cathode conductors 6, the intermediate insulator 10 and the grids 8 referred to hereinbefore.

If this should prove necessary, masking then takes place in one or more stages of the areas where holes are not to be produced. For this purpose reference should e.g. be made to the aforementioned document (2).

Then, according to the present invention, a photosensitive resin layer 22 is spread over the entire surface of the structure 20 obtained. The thickness of the resin layer 22 is e.g. 1.2 μm and its refractive index is 1.7. The resin layer 22 is then hardened by stoving.

A monolayer of glass balls 24 is then spread on the surface of the resin layer 22 by centrifuging or spraying. The balls 28, e.g., have a diameter of 4 μm and a refractive index of 1.5.

The resin is then exposed through said monolayer of balls 28 by means of a light with a wavelength of 500 nm.

The balls 28 are then removed from the thus exposed resin layer 22 and the resin is developed, i.e. the resin is dissolved in the exposed areas. Thus, the holes are obtained at the location of the exposed areas.

It is pointed out that for removing the balls 28 from the resin layer 22, it is merely necessary to use a liquid which is poured onto the resin layer 22 and which moves the balls 28 with it.

Ultrasonics can be used for facilitating the separation of the balls.

Deionized water is e.g. used as the entrainment or moving liquid, which can then be filtered to recover the balls.

It is also possible not to remove the balls from the resin layer prior to its development. The balls will then be eliminated during the dissolving of the resin in the exposed areas and recovered by filtering the solvent used for development.

Having in this way obtained the holes in the resin layer, the production process of the electron source having emissive cathodes with microtips is continued in the following way.

Through the holes formed in the resin layer etching takes place of the grids 8 and the intermediate insulator 10 in order to form there the holes 14 (FIG. 1). The resin layer is then removed.

Under grazing incidence is then deposited the nickel layer 12 on the structure obtained. The molybdenum layer 16 is then deposited, leading to the formation of the microtips 18 and removal takes place of the nickel layer 12 and the molybdenum layer 16.

Figure 7:
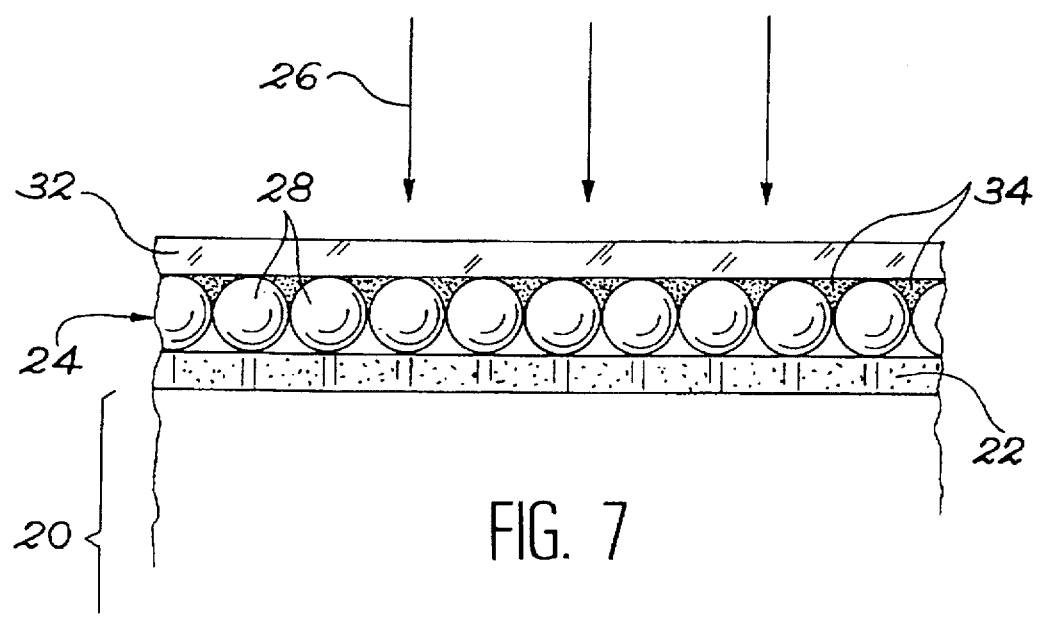
FIG. 7 Diagrammatically another process according to the invention using a monolayer of balls formed on a support.

Another process according to the invention is illustrated in FIG. 7. According to this other process, the balls are not directly deposited on the surface of the photosensitive resin layer 22. These balls 28 are maintained on a planar support 32, which is transparent to the exposure light.

Thus, once again a monolayer of balls is obtained, which is applied to the photosensitive resin layer 22. The latter is then irradiated through the transparent support 32 and the balls 28.

To maintain the balls 28 on the support 32, use can be made of a binder 34 e.g. constituted by a polymer such as polymethyl methacrylate or a gel such as colloidal silica.

To keep the balls on the support 32 by means of the binder 34, it is e.g. possible to centrifuge a mixture of balls and binder on the surface of the support 32.

As a variant for keeping the balls on the support 32, the balls are mixed with a liquid such as a mixture of deionized water and ethanol or such as e.g. pure ethanol.

A layer of said liquid is then spread on the support 32 and the liquid evaporated. As a result the monolayer of balls is obtained on the support 32. In this case, the balls are maintained on said support 33 by electrostatic forces.

Use is e.g. made of a silica support 32 for an exposure light in the near ultraviolet.

What is claimed as new and desired to be secured by Letters Patent of the United States is:

1. A process for the formation of holes in a positive, photosensitive resin layer by means of an exposure light, said process comprising the steps of:

forming a monolayer of balls transparent to said exposure light and in direct contact with the resin layer;

exposing the resin layer by the exposure light through the monolayer of balls, each of said balls concentrating said light at a contact point of said ball with the resin layer on which it is placed, thus bringing about an exposure of an area of said resin layer, the exposure light forming a parallel, collimated beam with a constant light intensity over the entire monolayer of balls; and developing the thus exposed resin layer leading to a formation of holes in said layer at a location of the exposed areas.

2. A process according to claim 1, wherein the balls are contiguous.

3. A process according to claim 1, wherein the balls are non-contiguous.

4. A process according to claim 3, wherein the non-contiguous balls have a random distribution.

5. A process according to claim 1, wherein said step of forming the monolayer of balls comprises the step of depositing said balls on a surface of the photosensitive resin layer.

6. A process according to claim 5, wherein the balls are deposited by centrifuging on the surface of the photosensitive resin layer.

7. A process according to claim 5, wherein the balls are deposited by spraying on the surface of the photosensitive resin layer.

8. A process according to claim 5, further comprising the step of removing the balls from the surface of the photosensitive resin layer prior to the development of the photosensitive resin layer.

9. A process according to claim 8, wherein the balls are removed from the photosensitive resin layer by entrainment by means of a liquid or in a bath exposed to ultrasonic action.

10. A process according to claim 5, wherein the balls are left on the resin layer until the resin layer is developed and are then entrained into a development bath of said resin layer.

11. A process according to claim 1, wherein the monolayer of balls is formed while maintaining said balls on a support transparent to the exposure light and by applying the thus maintained balls to a surface of the photosensitive resin layer.

12. A process according to claim 11, wherein the balls are maintained on the support by means of a binder or electrostatic forces.

13. A process according to claim 1, wherein the balls have a diameter of approximately 1 to 10 µm.

14. A process for the production of an electron source having emissive cathodes with microtips, comprising:

forming a structure which includes cathode conductors on a substrate, an electrically insulating layer on said cathode conductors and, on said electrically insulating layer, grids which form an angle with the cathode conductors;

forming holes through the grids and the insulating layer in areas where the grids intersect the cathode conductors; and forming electron-emitting material microtips in these holes on the cathode conductors;

wherein the holes are obtained by forming a positive, photosensitive resin layer on the surface of the structure, by forming holes in the resin layer according to the hole formation process according to claim 1 and by etching the grids and the insulating layer through the holes formed in the resin layer.

* * * * *